US012111565B2

(12) United States Patent
Goda et al.

(10) Patent No.: US 12,111,565 B2
(45) Date of Patent: Oct. 8, 2024

(54) REFLECTIVE PHOTOMASK BLANK AND REFLECTIVE PHOTOMASK

(71) Applicant: TOPPAN INC., Tokyo (JP)

(72) Inventors: Ayumi Goda, Tokyo (JP); Norihito Fukugami, Tokyo (JP)

(73) Assignee: TOPPAN INC., Tokyo (JP)

( * ) Notice: Subject to any disclaimer, the term of this patent is extended or adjusted under 35 U.S.C. 154(b) by 411 days.

(21) Appl. No.: 17/615,083

(22) PCT Filed: May 28, 2020

(86) PCT No.: PCT/JP2020/021196
§ 371 (c)(1),
(2) Date: Nov. 29, 2021

(87) PCT Pub. No.: WO2020/241780
PCT Pub. Date: Dec. 3, 2020

(65) Prior Publication Data
US 2022/0221784 A1  Jul. 14, 2022

(30) Foreign Application Priority Data

May 31, 2019 (JP) .................. 2019-102991

(51) Int. Cl.
G03F 1/24 (2012.01)
G03F 1/54 (2012.01)
(52) U.S. Cl.
CPC . *G03F 1/24* (2013.01); *G03F 1/54* (2013.01)
(58) Field of Classification Search
CPC .................................. G03F 1/24; G03F 1/54
USPC ........................................................... 430/5
See application file for complete search history.

(56) References Cited

U.S. PATENT DOCUMENTS

| 2011/0104595 A1 | 5/2011 | Hayashi et al. |
| 2011/0281207 A1 | 11/2011 | Hosoya |
| 2012/0021344 A1 | 1/2012 | Matsuo |
| 2012/0107733 A1 | 5/2012 | Hayashi et al. |
| 2013/0260288 A1 | 10/2013 | Yu et al. |
| 2015/0064611 A1 | 3/2015 | Shih et al. |
| 2019/0265585 A1 | 8/2019 | Ikebe et al. |

FOREIGN PATENT DOCUMENTS

| JP | 2001-237174 A | 8/2001 |
| JP | 2004-207593 A | 7/2004 |
| JP | 2005-268255 A | 9/2005 |
| JP | 2007-207829 A | 8/2007 |
| JP | 2010-103463 A | 5/2010 |
| JP | 6408790 B2 | 10/2018 |
| KR | 2018-0127197 A | 11/2018 |
| WO | WO 2010/090132 A1 | 8/2010 |
| WO | WO 2011/004850 A1 | 1/2011 |
| WO | WO 2018/074512 A1 | 4/2018 |

OTHER PUBLICATIONS

EPO Communication dated Jul. 21, 2022 forwarding the extended European Search Report for European Patent Application No. 20815301.5, 7 pages.
International Preliminary Report on Patentability for PCT Application No. PCT/JP2020/021196 dated Nov. 16, 2021, 5 pages.

*Primary Examiner* — Christopher G Young
(74) *Attorney, Agent, or Firm* — Squire Patton Boggs (US) LLP

(57) ABSTRACT

There are provided a reflective photomask blank and a reflective photomask, which are compatibly capable of suppressing a shadowing effect and improving the life of a mask. A reflective photomask blank (10) includes a substrate (1), a reflection part (7) provided on the substrate (1) and configured to reflect incident light, and a low reflection part (8) provided on the reflection part (7) and configured to absorb incident light. The low reflection part (8) has a multi layer structure of at least two layers or more layers. An outermost layer (5) of the low reflection part (8) has a refractive index n equal to or more than 0.90 and an extinction coefficient k equal to or less than 0.02 with respect to extreme ultraviolet (EUV) light (where a wavelength is 13.5 nm).

18 Claims, 6 Drawing Sheets

REFLECTIVE PHOTOMASK BLANK AND REFLECTIVE PHOTOMASK

CROSS-REFERENCE

This application is a National Stage filing under 35 U.S.C. § 371 of International Patent Application No. PCT/JP2020/021196, filed May 28, 2020, which claims the benefit of and priority to JP Application No. JP 2019-102991, filed May 31, 2019, both applications are incorporated herein by reference in their entirety for all purposes.

TECHNICAL FIELD

The present invention relates to a reflective photomask blank and a reflective photomask.

BACKGROUND ART

As the nanofabrication of a semiconductor device proceeds, the nanofabrication in photolithography technology is highly demanded in the manufacturing process of the semiconductor device. In photolithography, the minimum resolution dimension of a transfer pattern largely depends on the wavelength of the exposure light source, and the shorter the wavelength is, the smaller minimum resolution dimension can be obtained. As a result, in the manufacturing process of a semiconductor device, the conventional exposure light source that uses ArF excimer laser light having a wavelength of 193 nm has been replaced with an exposure light source that uses extreme ultraviolet (EUV) light having a wavelength of 13.5 nm.

EUV light has a short wavelength, and thus most substances have high light absorbability to the EUV light. For this reason, the photomask for EUV is a reflective photomask, unlike the conventional transmissive photomask (for example, PTL 1 and PTL 2). PTL 1 discloses forming a multilayer film in which two or more types of material layers are cyclically deposited on abase substrate, on a reflective exposure mask that is used for EUV lithography, and forming a mask pattern made of a metal film containing a nitride or composed of a multi-layer structure of a metal nitride film and a metal film, on the multilayer film. PTL 2 discloses a reflective mask in which an absorber film is provided on a multilayer reflective film. The absorber film is constituted of a phase control film and a multi-layer film in which high refractive index material layers and low refractive index material layers are alternately deposited.

As described above, in the EUV lithography, it is not possible to use the dioptric system that utilizes light transmission, and thus an optical system member of the EUV exposure apparatus is not a lens but a mirror. Generally, the EUV lithography adopts a method in which EUV light is incident with the optical axis being tilted by 6° from the vertical direction of the EUV photomask, and the reflected light reflected at an angle of −6° is applied onto a resist film on the semiconductor substrate. As described above, since the optical axis of the incident light is tilted with respect to the vertical direction of the EUV photomask in the EUV lithography, a shadow of the absorption layer pattern is formed on the EUV photomask, which causes a problem that the performance of transfer of the absorption layer pattern to the resist film is deteriorated. This deterioration of the transfer performance due to a shadow is called a shadowing effect.

PTL 2 discloses that in a case where a film having an extinction coefficient k equal to or more than 0.03 with respect to EUV light is used as the phase control film and the low refractive index material layer, it is possible to make the thickness of the absorber film thinner (equal to or less than 60 nm) than before and to suppress the shadowing effect. Further, PTL 3 discloses a method in which a compound material having a high absorbability (an extinction coefficient) with respect to EUV light is adopted for an absorbing film containing Ta as a main component or a phase shift film to make the film thickness thin so that a shadowing effect is reduced.

CITATION LIST

Patent Literatures

PTL 1: JP 2001-237174 A
PTL 2: Japanese Patent No. 6408790
PTL 3: WO 2011/004850

SUMMARY OF INVENTION

Technical Problem

A photomask is washed with an acidic or alkaline washing solution for regular maintenance. In addition, in an EUV exposure apparatus, a reflective photomask is exposed to a hydrogen radical environment and cleaned so that the pollution in the chamber due to contamination is prevented. In a reflective photomask, in a case where washing with an acidic or alkaline washing solution or cleaning with hydrogen radicals is repeatedly performed, there is a possibility that the pattern including an absorbing film is etched and the film is reduced.

In a reflective photomask, making the thickness of the pattern including an absorbing film thin is effective in suppressing a shadowing effect. However, the thinner the pattern, the smaller the margin of film reduction. The inventors of the present invention found that in the reflective photomask, in a case where the thickness of the pattern is made thin for the purpose of suppressing a shadowing effect, the margin of film reduction of the pattern is reduced, and there is a possibility that the life of a mask is shortened due to the cleaning using hydrogen radicals or the like.

The present invention has been made in consideration of such circumstances, and an object of the present invention is to provide a reflective photomask blank and a reflective photomask, which are compatibly capable of suppressing the shadowing effect and improving the life of a mask.

Solution to Problem

A reflective photomask blank according to one aspect of the present invention includes a substrate, a reflection part provided on the substrate and configured to reflect incident light, and a low reflection part provided on the reflection part and configured to absorb incident light, in which the low reflection part has a multi-layer structure including at least two or more layers and an outermost layer of the low reflection part has a refractive index n equal to or more than 0.90 and an extinction coefficient k equal to or less than 0.02 with respect to extreme ultraviolet (EUV) light (where a wavelength is 13.5 nm).

A reflective photomask according to one aspect of the present invention includes a substrate, a reflection part provided on the substrate and configured to reflect incident light, and a low reflection part provided on the reflection part and configured to absorb incident light, in which the low reflection part has a multi-layer structure including at least two or more layers and an outermost layer of the low reflection part has a refractive index n equal to or more than 0.90 and an extinction coefficient k equal to or less than 0.02 with respect to extreme ultraviolet (EUV) light (where a wavelength is 13.5 nm).

Advantageous Effects of Invention

According to the present invention, it is possible to provide a reflective photomask blank and a reflective photomask, which are compatibly capable of suppressing a shadowing effect and improving the life of a mask.

DESCRIPTION OF EMBODIMENTS

Hereinafter, a reflective photomask blank and a reflective photomask according to the present invention will be described with reference to the drawings.

Figure 1:
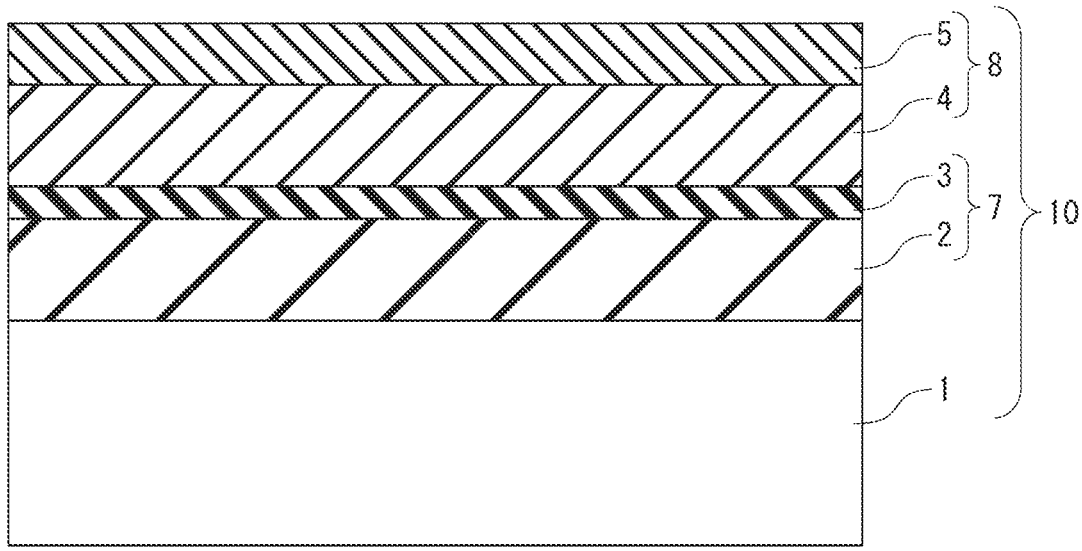
FIG. 1 is a schematic cross-sectional view illustrating a configuration example of a reflective photomask blank according to an embodiment of the present invention.
Figure 2:
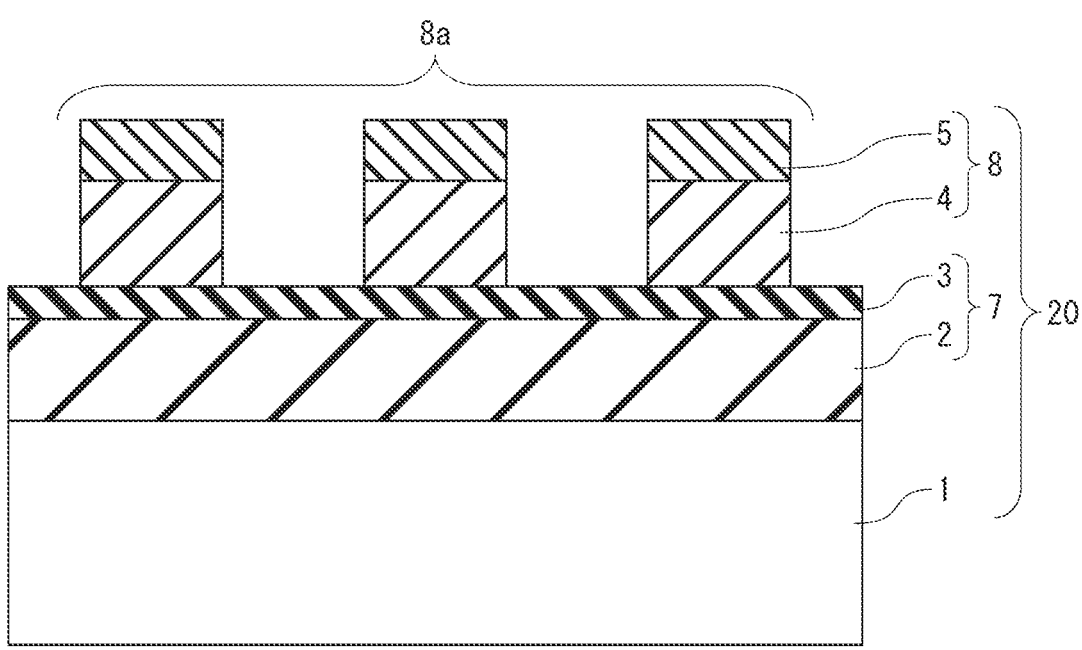
FIG. 2 is a schematic cross-sectional view illustrating a configuration example of a reflective photomask according to an embodiment of the present invention.

FIG. 1 is a schematic cross-sectional view illustrating a configuration example of a reflective photomask blank 10 according to an embodiment of the present invention. FIG. 2 is a schematic cross-sectional view illustrating a configuration example of a reflective photomask 20 according to an embodiment of the present invention. The reflective photomask 20 illustrated in FIG. 2 is formed by patterning a low reflection part 8 of the reflective photomask blank 10 illustrated in FIG. 1.

As illustrated in FIG. 1 and FIG. 2, the reflective photomask blank 10 and the reflective photomask 20 include a multilayer reflective film 2 provided on a substrate 1 and a capping layer 3 provided on the multilayer reflective film 2. A reflection part 7 is constituted of the multilayer reflective film 2 and the capping layer 3. Further, the reflective photomask blank 10 and the reflective photomask 20 include the low reflection part 8 provided on the reflection part 7. The low reflection part 8 has a multi-layer structure of at least two layers or more layers. The multi-layer structure has an absorption layer 4 and an outermost layer 5 provided on the absorption layer 4. The outermost layer 5 has a refractive index n equal to or more than 0.90 and an extinction coefficient k equal to or less than 0.02 with respect to EUV light having a wavelength of 13.5 nm.

(Configuration Example of Substrate)

As the substrate 1, a flat Si substrate, a synthetic quartz substrate, or the like can be used. In addition, as the substrate 1, low thermal expansion glass to which titanium is added can be used. The substrate 1 may be constituted of a material having a low thermal expansion coefficient and is not limited thereto.

(Configuration Example of Reflection Part)

The multilayer reflective film 2 reflects extreme ultraviolet light (EUV light), which is exposure light, and is constituted of a combination of materials having largely different refractive indexes with respect to EUV light. For example, the multilayer reflective film 2 is composed of the repeated deposition layer of a combination of molybdenum (Mo) and silicon (Si) or molybdenum (Mo) and beryllium (Be) for about 40 cycles.

The capping layer 3 functions as an etching stopper that prevents damage to the multilayer reflective film 2 in a case where the low reflection part 8 is etched to form a low reflection part pattern 8a. The capping layer 3 is constituted of a material that is resistant to the etching conditions of the absorption layer 4. The capping layer 3 may be not present in the reflective photomask blank 10 and the reflective photomask 20. The capping layer 3 may be not present in a case where the multilayer reflective film 2 is not damaged or the influence of the damage is small even in a case being damaged, depending on the material of the multilayer reflective film 2 or the etching conditions of the absorption layer 4.

Further, although not illustrated in the drawing, the reflective photomask blank 10 and the reflective photomask 20 may include a back surface conductive film on a side of the back surface of the substrate 1. The side of the back surface of the substrate 1 is a surface (hereinafter, referred to as a back surface) opposite to the surface on which the multilayer reflective film 2 is formed, in the substrate 1. The back surface conductive film is a film for fixing the reflective photomask 20 to the EUV exposure apparatus by utilizing the principle of the electrostatic chuck.

(Configuration Example of Low Reflection Part)

In the reflective photomask blank 10, the low reflection part 8 having the absorption layer 4 and the outermost layer 5 can be processed to form a pattern. For example, the absorption layer 4 is constituted of tin oxide (SnO) or indium oxide (InO). Tin oxide and indium oxide can be dry-etched with a chlorine-based gas. The outermost layer 5 is constituted of silicon oxide (SiO). Silicon oxide can be dry-etched with a fluorine-based gas. Silicon oxide is hardly etched with a chlorine-based gas, and thus in a case where the absorption layer 4 is made of tin oxide or indium oxide and the outermost layer 5 is made of silicon oxide, the outermost layer 5 acts as an etching mask with respect to the absorption layer 4.

Further, the photomask cannot withstand long-term use unless it has the low reflection part 8 having high resistance to an acidic or alkaline washing solution. Generally, an oxide, a nitride, or an oxynitride has a higher resistance (hereinafter, referred to as washing resistance) to a washing solution of an acid or alkali, which is used for washing a photomask as compared with a simple substance metal. In addition, the higher the oxygen rate, the higher the washing resistance. As a result, it is preferable that the absorption layer 4 is constituted of a compound material in which an atomic number ratio of tin (Sn) to oxygen (O) is within a range of 1:1 to 1:2, and the total content of the tin and the oxygen is 75% by atom or more of the whole compound material. Alternatively, it is preferable that the absorption layer 4 is constituted of a compound material in which an atomic number ratio of Indium (In) to oxygen (O) is within a range of 1:1 to 1:1.5, and the total content of the indium and the oxygen is 80% by atom or more of the whole compound material. Further, in order to have sufficient washing resistance, it is preferable that the outermost layer 5 is constituted of a compound material in which an atomic number ratio of silicon (Si) to oxygen (O) is within a range of 1:1.5 to 1:2, and the total content of the silicon and the oxygen is 50% by atom or more of the whole compound material.

In the embodiment of the present invention, it is described that the washing resistance is high in a case where the amount of film reduction is 1 nm or less when a film is immersed in sulfuric acid at 80° C. for 10 minutes and the amount of film reduction is 1 nm or less when megasonic washing is used at 500 W and a film is immersed for 10 minutes in a tank of a washing solution in which ammonia, hydrogen peroxide, and water are mixed at a mass ratio of 1:1:20. In a case where each of the compound materials constituting the absorption layer 4 and the outermost layer 5 satisfies these conditions, it is possible to realize the low reflection part pattern 8a having high washing resistance.

The absorption layer 4 is formed on the capping layer 3 by sputtering; however, it is preferable that the absorption layer 4 has sufficiently an amorphous property so that the roughness or in-plane dimension uniformity of the absorption layer pattern and the in-plane uniformity of the transferred image are improved. In order to make the absorption layer 4 have an amorphous property, the compound material constituting the absorption layer 4 preferably contains one or more elements selected from boron (B), nitrogen (N), silicon (Si), germanium (Ge), and hafnium (Hf) and more preferably contains one or more of these elements at an atomic composition ratio of less than 10%.

The outermost layer 5 is formed on the absorption layer 4 by sputtering; however, it is preferable that the outermost layer 5 has sufficiently an amorphous property so that the roughness or in-plane dimension uniformity of the outermost layer pattern and the in-plane uniformity of the transferred image are improved. In order to make the outermost layer 5 have an amorphous property, the compound material constituting the outermost layer 5 preferably contains one or more elements selected from boron (B), nitrogen (N), germanium (Ge), and hafnium (Hf), and more preferably contains one or more of these elements at an atomic composition ratio of less than 10%.

In the EUV exposure apparatus, the reflective photomask 20 is exposed to a hydrogen radical environment. For this reason, the outermost layer 5 is preferably constituted of a compound material having high hydrogen radical resistance. For example, the outermost layer 5 is preferably constituted of a compound material containing silicon as a main material, such as the above-described silicon oxide. Alternatively, the outermost layer 5 may be constituted of a compound material containing at least one of a transition metal, bismuth, and silicon as a main material. A transition metal, bismuth, and silicon are less reactive with respect to hydrogen and less volatile than other metal materials. As a result, the hydrogen radical resistance of the low reflection part 8 can be enhanced, and the reflective photomask 20 can be used as a mask that can withstand long-term use.

In the embodiment of the present invention, it is described that the hydrogen radical resistance is high in a case where an inter-electrode distance between a pair of electrodes arranged in the chamber is 18 mm, the flow rate of hydrogen $H_2$ introduced into the chamber is $10^{19}$ at/(cm$^2$ s), and the film reduction rate in a hydrogen radical environment in which hydrogen is excited between electrodes using capacitively coupled plasma (CCP) of 40 MHz is 0.1 nm/s or less. In a case where the compound materials constituting the outermost layer 5 satisfy these conditions, it is possible to realize the low reflection part pattern 8a having high hydrogen radical resistance.

In EUV lithography, EUV light is obliquely incident from the side of the low reflection part pattern 8a of the reflective photomask 20, reflected by the reflection part 7, and incident on the resist film on the wafer. Here, in a case where the EUV light incident on the reflective photomask 20 makes a shadow of the low reflection part pattern 8a on the reflection part 7, the performance of transfer to the resist film is deteriorated (a shadowing effect).

In order to suppress the shadowing effect, the main material of the outermost layer 5 is preferably a compound material having a low extinction coefficient k with respect to EUV light so that the optical path is not obstructed. For example, in order to suppress the deterioration of resolution due to the shadowing effect within 10%, it is preferable that the extinction coefficient k of the outermost layer 5 is 0.02 or less and the film thickness thereof is 20 nm or less.

In order to suppress the shadowing effect, it is preferable that the absorption layer 4 is constituted of a compound material having a refractive index n equal to or less than 0.95 and an extinction coefficient k equal to or more than 0.06 with respect to EUV light.

Figure 3:
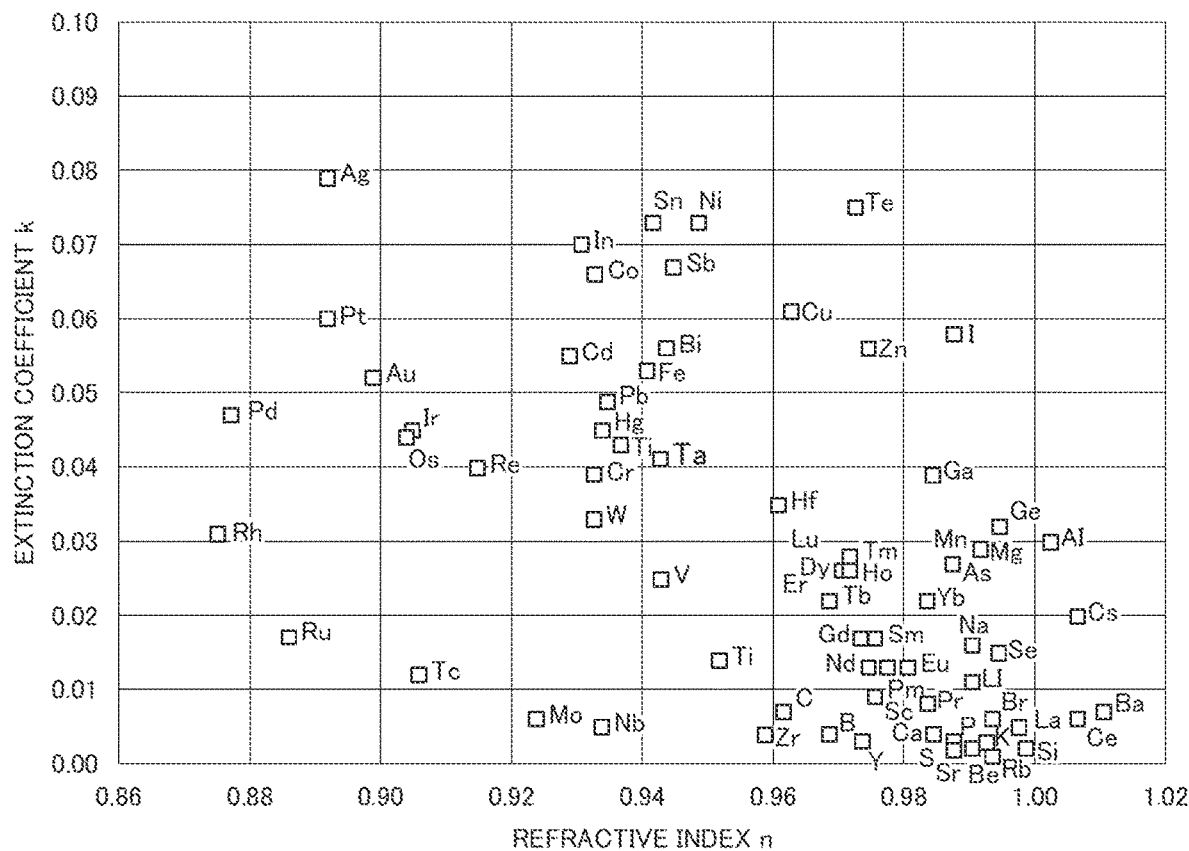
FIG. 3 is a graph showing optical constants of metal materials with respect to EUV light (wavelength: 13.5 nm).

FIG. 3 is a graph showing optical constants of metal materials with respect to EUV light (wavelength: 13.5 nm). In FIG. 3, the horizontal axis indicates the refractive index n, and the vertical axis indicates the extinction coefficient k. As disclosed in PTL 3 described above, an absorbing film containing tantalum (Ta) as a main component has been conventionally used; however, the extinction coefficient k of Ta with respect to EUV light is 0.041. In a case of a compound material having an extinction coefficient higher than Ta, the thickness of the absorption layer 4 can be reduced. In a case where the extinction coefficient k is 0.06 or more, the thickness of the absorption layer 4 can be made sufficiently thin, and the shadowing effect can be further reduced.

The compound material satisfying the above combination of optical constants (nk values) includes silver (Ag), platinum (Pt), indium (In), cobalt (Co), tin (Sn), nickel (Ni), and tellurium (Te), as shown in FIG. 3.

The main material of the outermost layer 5 is preferably a compound material having a refractive index close to 1 in the vacuum. This makes it possible to suppress the deterioration of resolution due to surface reflection of the outermost layer 5.

The low reflection part 8 preferably has an optical density (an CD value) equal to or more than 1.5 with respect to the reflection part 7. That is, the low reflection part 8 preferably has a combination of a compound material and a film thickness that makes an OD value equal to or more than 1.5 with respect to the reflection part 7. The OD value is an index indicating the contrast of light intensity between the reflection part 7 and the low reflection part 8. In a case where the OD value is large, contrast is good, and high transfer performance is obtained. The OD value is expressed by Equation (1).

$$OD = -\log(Ra/Rm) \quad (1)$$

In Equation (1), Ra is the reflectivity of the low reflection part 8, and Rm is the reflectivity Rm of the reflection part 7.

As described above, in order to suppress the shadowing effect, it is effective to make the film thickness of the absorption layer 4 thin. A compound material containing Ta as a main component has been applied to the conventional absorbing film; however, a film thickness of 40 nm or more has been required to obtain an OD value of 1 or more, and a film thickness of 70 nm or more has been required to obtain an OD value of 2 or more. The extinction coefficient of Ta is 0.041; however, in a case where a compound material having an extinction coefficient of 0.06 or more is applied to the absorption layer 4, the film thickness of the absorption layer 4 can be made thin even in a case where the OD value is the same. According to Beer's law, for example, in a case where a compound material having an extinction coefficient of 0.06 or more is applied to the absorption layer 4, a film thickness of 27 nm or more is required to obtain an OD value of 1 or more, and a film thickness of 48 nm or more is required to obtain an OD value of 2 or more.

An example of the film thickness of the absorption layer 4 and the outermost layer 5 is described. The film thickness of the absorption layer 4 is, for example, 18 nm or more and 48 nm or less. The film thickness of the outermost layer 5 is, for example, 1 nm or more and 20 nm or less. The film thicknesses of the low reflection part 8 and the low reflection part pattern 8a, which have the absorption layer 4 and the outermost layer 5, are for example, 19 nm or more and 68 nm or less, respectively.

As described above, the reflective photomask blank 10 and the reflective photomask 20 according to the embodiment of the present invention include the substrate 1, the reflection part 7 provided on the substrate 1 and configured to reflect incident light, and the low reflection part 8 provided on the reflection part and configured to absorb incident light. The low reflection part 8 has a multi-layer structure of at least two layers or more layers. The outermost layer 5 of the low reflection part 8 has a refractive index n equal to or more than 0.90 and an extinction coefficient k equal to or less than 0.02 with respect to EUV light. For example, the outermost layer 5 is constituted of a compound material in which anatomic number ratio of silicon (Si) to oxygen (O) is within a range of 1:1.5 to 1:2, and the total content of the silicon and the oxygen is 50% by atom or more of the whole compound material. Silicon (Si) has an extinction coefficient k of 0.0018 and a refractive index n of 0.999, which satisfy the above optical conditions.

According to this, since the outermost layer 5 has an extinction coefficient k equal to or less than 0.02 with respect to EUV light, the absorption of EUV light can be suppressed. The outermost layer pattern formed from the outermost layer 5 suppresses the formation of shadow due to incident light, and thus the shadowing effect can be suppressed.

Further, as the material constituting the outermost layer 5, a material having high washing resistance and high hydrogen radical resistance can be used. These make it possible to suppress the film reduction of the low reflection part pattern 8a in the washing process using an acidic or alkaline washing solution or the cleaning process using hydrogen radicals.

Further, the outermost layer pattern can suppress the formation of shadow due to the incident light, and thus it can be formed to have a thick film thickness. In a case where the outermost layer pattern is formed to have a thick film thickness, it is possible to increase the margin of film reduction in the above-described washing process and cleaning process. Since the film reduction of the outermost layer pattern can be suppressed and the margin of film reduction can be increased, the life of a mask can be improved.

EXAMPLE

Hereinafter, a reflective photomask blank and a reflective photomask according to Examples of the present invention will be described with reference to figures and tables.

Example 1

Figure 4:
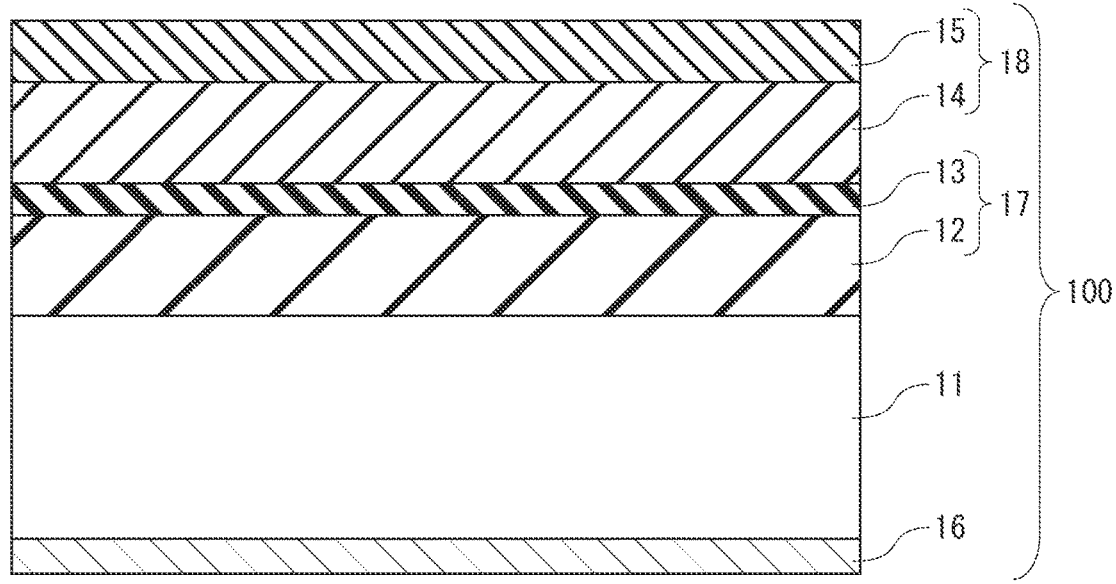
FIG. 4 is a schematic cross-sectional view illustrating a structure of a reflective photomask blank 100 according to Example 1 of the present invention.

FIG. 4 is a schematic cross-sectional view illustrating a structure of a reflective photomask blank 100 according to Example 1 of the present invention. As illustrated in FIG. 4, a multilayer reflective film 12 was formed on a synthetic quartz substrate 11 having low thermal expansion characteristics. The multilayer reflective film 12 was composed of 40 pairs of deposited film layers, with each pair consisting of a silicon (Si) layer and a molybdenum (Mo) layer. The film thickness of the multilayer reflective film 12 was 280 nm. In FIG. 4, for convenience, the multilayer reflective film 12 is illustrated as several pairs of deposited films.

Next, a capping layer 13 formed of ruthenium (Ru) was formed into a film as an intermediate film on the multilayer reflective film 12 so that the film thickness was 2.5 nm. As a result, a reflection part 17 having the multilayer reflective film 12 and the capping layer 13 was formed on the substrate 11. An absorption layer 14 formed of tin oxide was formed on the capping layer 13 so that the film thickness was 26 nm. As a result of the measurement with X-ray photoelectron spectroscopy (XPS), the atomic number ratio of tin to oxygen in the absorption layer 14 was 1:1.6. In addition, as a result of the measurement with an X-ray diffractometer (XRD), it was found that the absorption layer 14 was amorphous although a slight crystallinity was observed.

Next, an outermost layer 15 formed of silicon oxide was formed into a film on the absorption layer 14 so that the film thickness was within a range of 4 nm to 20 nm. As a result of the measurement with X-ray photoelectron spectroscopy (XPS), the atomic number ratio of silicon to oxygen in the outermost layer 15 was 1:1.9. As a result, a low reflection part 18 having the absorption layer 14 and the outermost layer 15 was formed on the reflection part 17. Next, a back surface conductive film 16 was formed to a thickness of 100 nm on the side (that is, the side of the back surface) of the substrate 11, on which the multilayer reflective film 12 was not formed. The back surface conductive film 16 was formed of chromium nitride (CrN).

A multi-source sputtering apparatus was used to form the respective films on the substrate 11. The film thickness of each film was controlled by the sputtering time. Through the above processes, a reflective photomask blank 100 was prepared.

Figure 5:
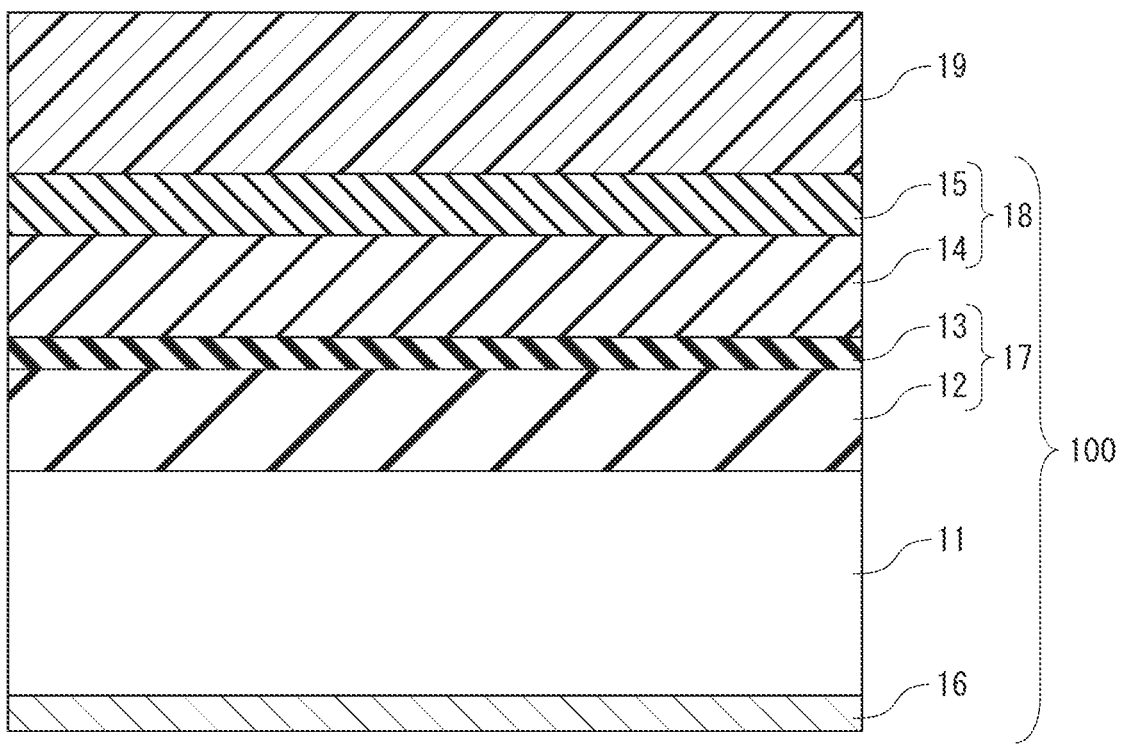
FIG. 5 is a schematic cross-sectional view illustrating a manufacturing method for a reflective photomask 200 according to Example 1 of the present invention in the order of processes.
Figure 6:
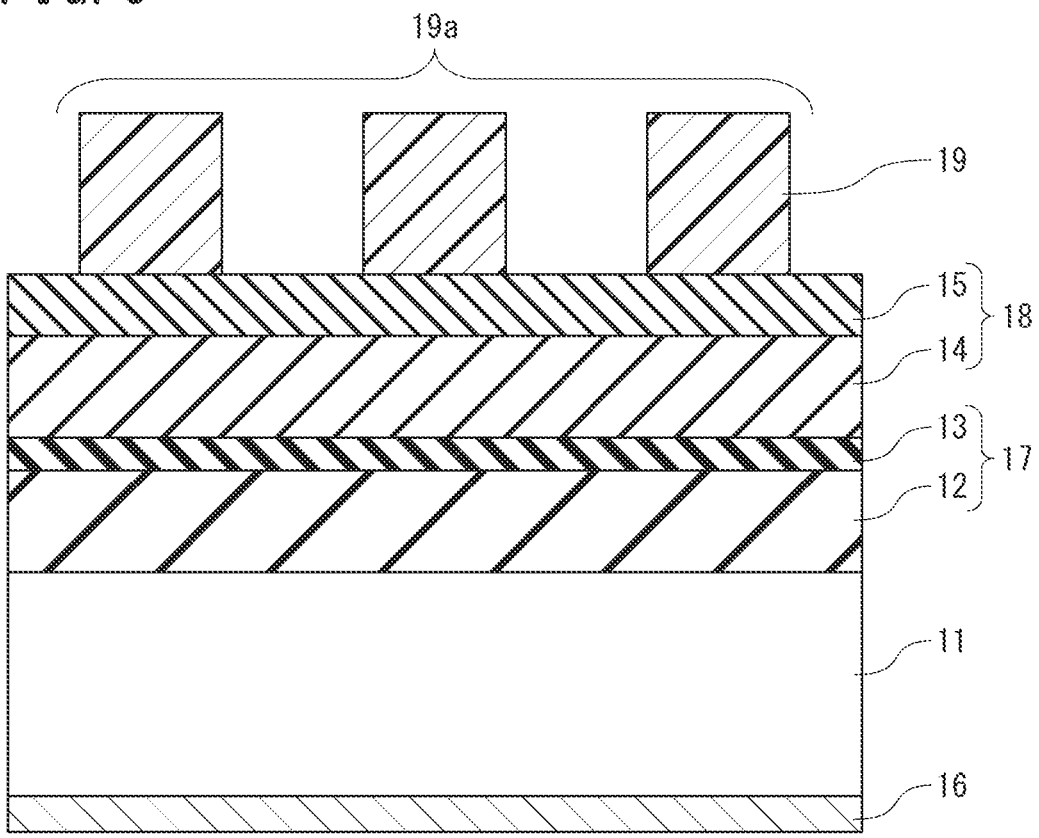
FIG. 6 is a schematic cross-sectional view illustrating the manufacturing method for the reflective photomask 200 according to Example 1 of the present invention in the order of processes.

Next, a reflective photomask 200 was prepared using the reflective photomask blank 100. FIG. 5 to FIG. 8 are schematic cross-sectional views illustrating a manufacturing method for the reflective photomask 200 according to Example 1 of the present invention in the order of processes. As illustrated in FIG. 5, a positive-type and chemical amplification-type resist (SEBP9012: manufactured by Shin-Etsu Chemical Co., Ltd.) was spin-coated on the low reflection part 18 provided in the reflective photomask blank 100 to form into a film having a film thickness of 120 nm, followed by baking at 110° C. for 10 minutes to form a resist film 19. Next, a predetermined pattern was drawn on the resist film 19 with an electron beam drawing machine (JBX3030: manufactured by JEOL Ltd.). Then, the baking treatment was carried out at 110° C. for 10 minutes, and subsequently spray development (SFG3000: manufactured by Sigmameltec Ltd.) was carried out. As a result, a resist pattern 19a as illustrated in FIG. 6 was formed.

Figure 7:
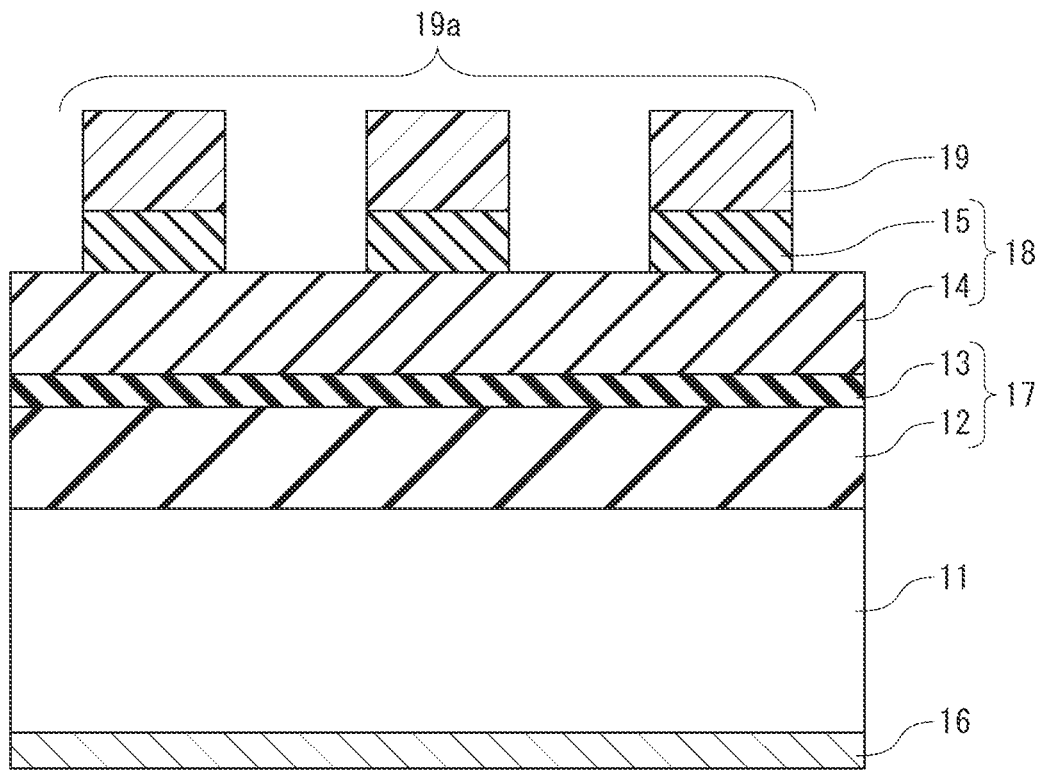
FIG. 7 is a schematic cross-sectional view illustrating the manufacturing method for the reflective photomask 200 according to Example 1 of the present invention in the order of processes.
Figure 8:
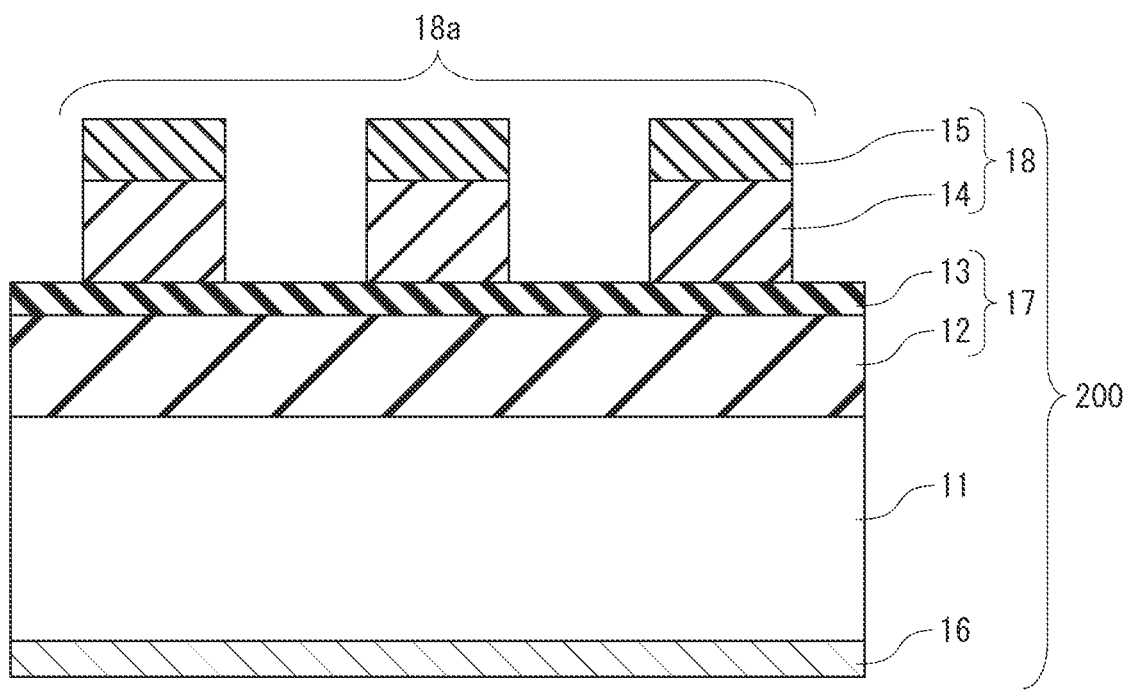
FIG. 8 is a schematic cross-sectional view illustrating the manufacturing method for the reflective photomask 200 according to Example 1 of the present invention in the order of processes.

Next, using the resist pattern 19a as an etching mask, the outermost layer 15 was patterned by dry etching mainly using a fluorine-based gas. As a result, an outermost layer pattern as illustrated in FIG. 7 was formed on the outermost layer 15. Next, the absorption layer 14 was patterned by dry etching mainly using a chlorine-based gas to form an absorption layer pattern. As a result, a low reflection part pattern 18a as illustrated in FIG. 8 was formed. Next, the remaining resist pattern 19a (see FIG. 7) was peeled off to prepare a reflective photomask 200 according to Example 1.

In Example 1, the low reflection part pattern 18a formed on the low reflection part 18 has a line and space (LS) pattern of a line width of 64 nm, an LS pattern of a line width of 200 nm for measuring the film thickness of the absorption layer 4 using an atomic force microscope (AFM), and a low reflection part removal part of a 4 mm×4 mm square for measuring EUV reflectivity.

Figure 9:
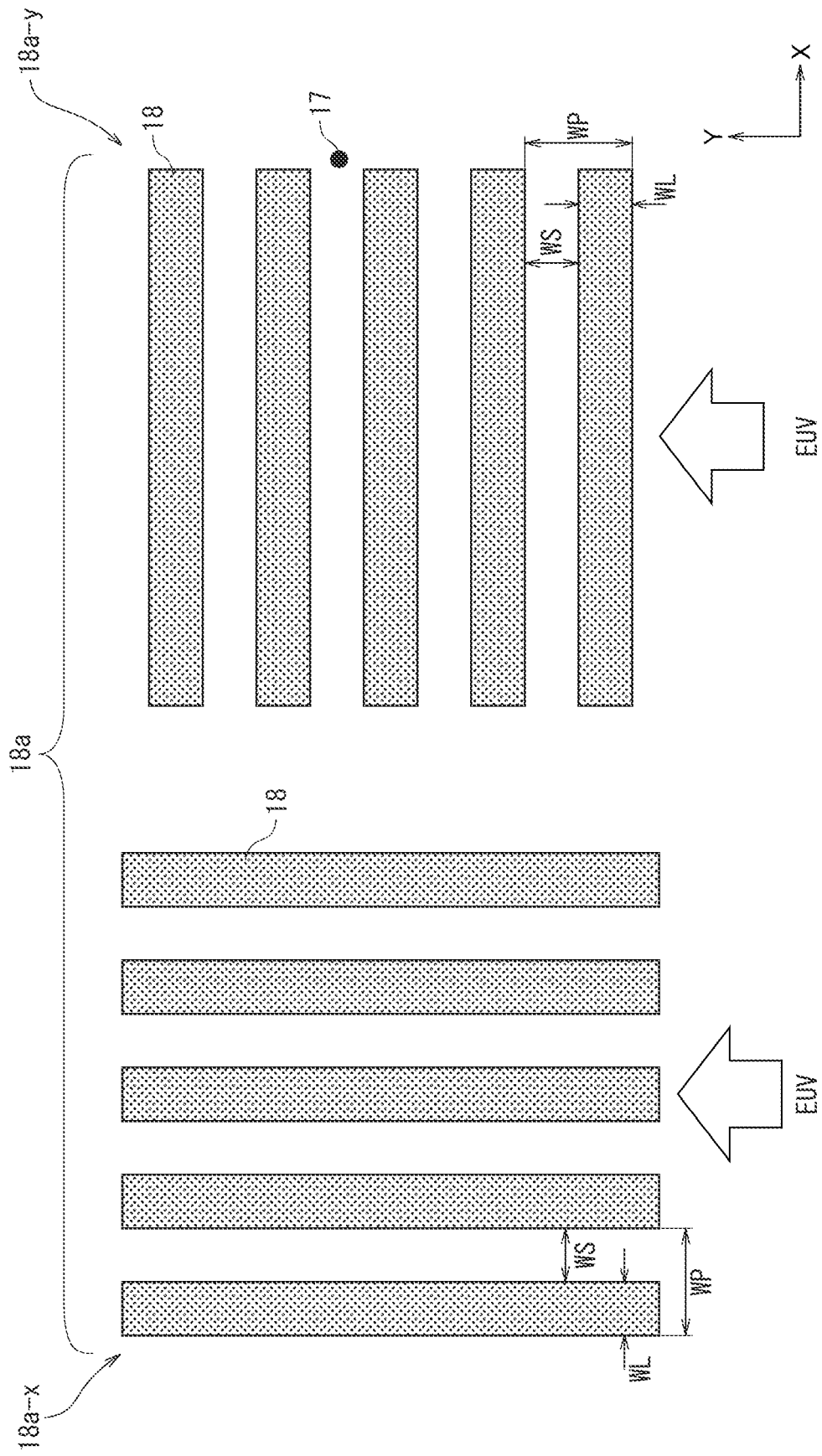
FIG. 9 is a plan view illustrating a low reflection part pattern 18a of the reflective photomask according to Example 1 of the present invention.

FIG. 9 is a plan view illustrating a low reflection part pattern 18a of the reflective photomask according to Example 1 of the present invention. In FIG. 9, the reference sign "WL" indicates the line width of the LS pattern, the reference sign "WS" indicates the space width of the LS pattern, and the reference sign "WP" indicates the arrangement pitch of the LS pattern. These satisfy a relationship of WP=WL+WS. In addition, the reference sign "18a-x" indicates an LS pattern extending in the x direction in the low reflection part pattern 18a. The reference sign "18a-y" indicates an LS pattern extending in the y direction in the low reflection part pattern 18a. In Example 1, LS patterns 18a-x and 18a-y each having WL=64 nm and WS=64 nm were formed.

Example 2

An absorption layer 14 was formed of indium oxide and formed into a film so that the film thickness was 26 nm. Next, an outermost layer 15 formed of silicon oxide was formed into a film on the absorption layer 14 so that the film thickness was within a range of 4 nm to 20 nm. As a result of the measurement with X-ray photoelectron spectroscopy (XPS), the atomic number ratio of indium to oxygen was 1:1.3. A reflective photomask blank 100 and a reflective photomask 200 were prepared in the same manner as in Example 1 except for the above changes.

Comparative Example 1

An absorption layer was formed of tin oxide and formed into a film so that the film thickness was 26 nm. Next, an outermost layer formed of tantalum (Ta) was formed into a film on the absorption layer so that the film thickness was within a range of 4 nm to 20 nm. A reflective photomask blank and a reflective photomask were prepared in the same manner as in Example 1 except for the above changes.

Comparative Example 2

An absorption layer was formed of tantalum (Ta) and formed into a film so that the film thickness was 40 nm. The outermost layer was not formed. A reflective photomask blank and a reflective photomask were prepared in the same manner as in Example 1 except for the above changes.

Comparative Example 3

An absorption layer was formed of tin oxide and formed into a film so that the film thickness was 26 nm. The outermost layer was not formed. A reflective photomask blank and a reflective photomask were prepared in the same manner as in Example 1 except for the above changes.

(Evaluation Method)

In Examples 1 and 2 and Comparative Examples 1 to 3 described above, the film thickness was measured with a transmission electron microscope. In Examples 1 and 2 and Comparative Examples 1 to 3 described above, the reflectivity Rm of the reflection part region and the reflectivity Ra of the low reflection part region in the prepared reflective photomask were measured with a reflectivity measuring device using EUV light. The reflectivity Rm was measured in an absorption layer removal part of a 4 mm×4 mm square. From the measurement result, the OD value was calculated using Equation (1) described above.

Figure 10:
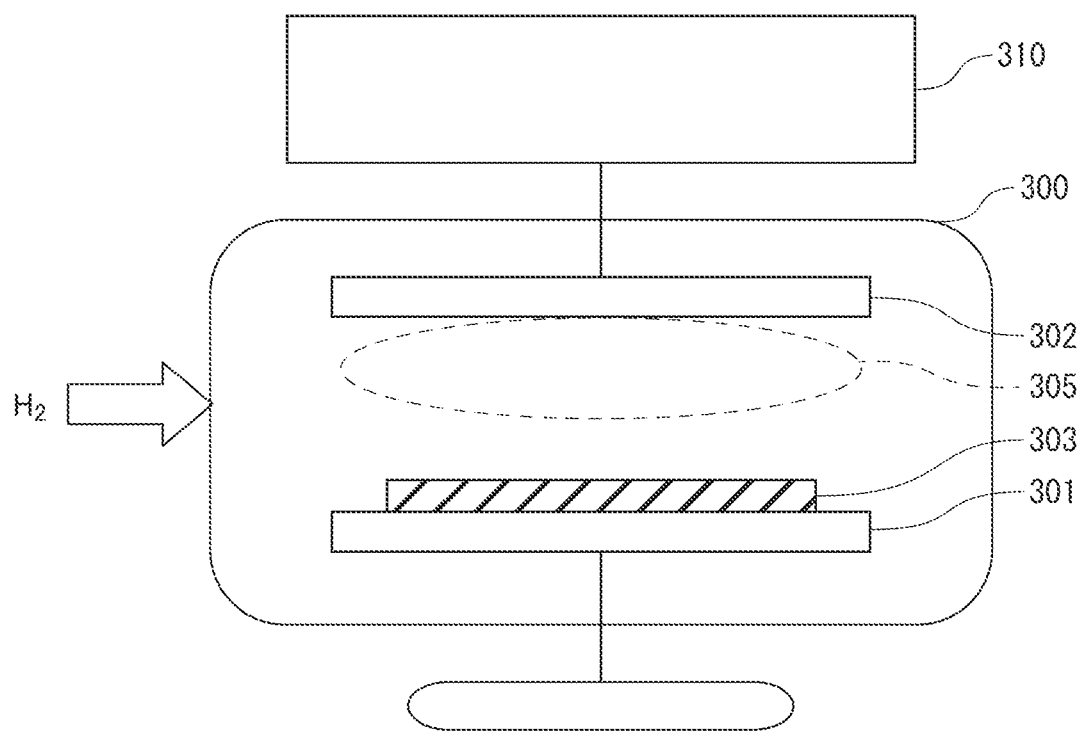
FIG. 10 is a schematic view illustrating a configuration example of a device for evaluating hydrogen radical resistance.

Using an evaluation device illustrated in FIG. 10, the hydrogen radical resistance of the reflective photomasks prepared in Examples 1 and 2 and Comparative Examples 1 to 3 was evaluated.

FIG. 10 is a schematic view illustrating a configuration example of a device for evaluating hydrogen radical resistance. As illustrated in FIG. 10, the evaluation device includes a chamber 300 and a plasma generating device 310 that generates hydrogen plasma 305 in the chamber 300. A lower electrode 301 and an upper electrode 302 facing the lower electrode 301 are provided in the chamber 300. An object to be evaluated 303 is arranged on the surface of the lower electrode 301 facing the upper electrode 302. The distance between the lower electrode 301 and the upper electrode 302 (hereinafter, referred to as inter-electrode) is 18 mm.

Each of the reflective photomasks prepared in Examples 1 and 2 and Comparative Examples 1 to 3 was arranged on the lower electrode 301 as the object to be evaluated 303. In this state, hydrogen $H_2$ was introduced into the chamber 300 at a flow rate of $10^{19}$ at/($cm^2$ s), and the introduced hydrogen $H_2$ was excited using CCP of 40 MHz to generate hydrogen radicals. The reflective photomasks prepared in Examples 1 and 2 and Comparative Examples 1 to 3 were exposed to hydrogen radicals and treated with the hydrogen radicals. In the low reflection part, the change in film thickness before and after the hydrogen radical treatment was checked using an atomic force microscope (AFM). The change in film thickness was measured using an LS pattern of a line width of 200 nm.

The low reflection part pattern of the reflective photomask prepared in Examples 1 and 2 and Comparative Examples 1 to 3 was transferred and exposed on a semiconductor wafer coated with an EUV positive-type and chemical amplification-type resist using an EUV exposure apparatus (NXE3300B: manufactured by ASML). The exposure amount was adjusted so that the LS pattern 18a-x in the x direction illustrated in FIG. 9 was transferred to the resist film at a line width of 16.0 nm as designed. The transferred resist pattern was observed, and the line width was measured with an electron beam dimension measuring machine to confirm the resolution.

(Evaluation Result)

The evaluation results are shown in Tables 1 to 5. Table 1 shows the evaluation results of the three reflective photomasks 200 according to Example 1. The evaluation items are the mask characteristics and the line width of the resist pattern transferred onto the wafer using the mask.

TABLE 1

| Absorption layer | | Outermost layer | | Mask characteristics | | Dimension | |
|---|---|---|---|---|---|---|---|
| Material | Film thickness | Material | Film thickness | OD | Hydrogen radical resistance | x direction | y direction |
| Tin oxide (n: 0.94, k: 0.07) | 26 nm | Silicon oxide (n: 0.98, k: 0.01) | 4 nm | 1.81 | 0.07 nm/s | 16.0 nm | 12.2 nm |
| | | | 10 nm | 1.88 | | 16.0 nm | 11.9 nm |
| | | | 20 nm | 2.11 | | 16.0 nm | 11.4 nm |

As shown in Table 1, the three reflective photomasks 200 according to Example 1 are reflective photomasks in which the absorption layer 14 is constituted of tin oxide (where the refractive index n is 0.94, and the extinction coefficient k is 0.07), and the outermost layer 15 is constituted of silicon oxide (where the refractive index n is 0.98, and the extinction coefficient k is 0.01). The film thickness of the absorption layer 14 is 26 nm, and the film thickness of the outermost layer 15 is 4 nm, 10 nm, and 20 nm.

As shown in Table 1, the hydrogen radical resistance of each of the three reflective photomasks 200 according to Example 1 was 0.07 nm/s. In Example 1, the measured hydrogen radical resistance value was 0.1 nm or less, which is the reference value for determination, and thus the results were good. Further, in a case where the film thickness of the outermost layer 15 was 4 nm, the CD value was 1.81, which was a high value. In the resist pattern formed by transferring the LS pattern 18a-y (see FIG. 9) in the y direction to the resist film, the line width in the y direction was 12.2 nm. In a case where the film thickness of the outermost layer 15 was increased to 20 nm, the OD value was improved; however, the shadowing effect was observed due to the increase in the film thickness, and the line width in the y direction was deteriorated to 11.4 nm.

Table 2 shows the evaluation results of the three reflective photomasks 200 according to Example 2. The evaluation items are the mask characteristics and the line width of the resist pattern transferred onto the wafer using the mask.

TABLE 2

| Absorption Saver | | Outermost layer | | Mask characteristics | | Dimension | |
|---|---|---|---|---|---|---|---|
| Material | Film thickness | Material | Film thickness | OD | Hydrogen radical resistance | x direction | y direction |
| Indium oxide (n: 0.92, k: 0 067) | 26 nm | Silicon oxide (n: 0.98, k: 0.01) | 4 nm | 1.68 | 0.07 nm/s | 16.0 nm | 12.1 nm |
| | | | 10 nm | 1.80 | | 16.0 nm | 11.8 nm |
| | | | 20 nm | 1.87 | | 16.0 nm | 11.2 nm |

As shown in Table 2, in the three reflective photomasks 200 according to Example 2, the absorption layer 14 is constituted of indium oxide (where the refractive index n is 0.92, and the extinction coefficient k is 0.067), and the outermost layer 15 is constituted of silicon oxide (where the refractive index n is 0.98, and the extinction coefficient k is 0.01). The film thickness of the absorption layer 14 is 26 nm, and the film thickness of the outermost layer 15 is 4 nm, 10 nm, and 20 nm.

As shown in Table 2, the hydrogen radical resistance of the reflective photomask 200 according to Example 2 was 0.07 nm/s. In Example 2, the measured hydrogen radical resistance value was 0.1 nm or less, which is the reference value for determination, and thus the results were good. Further, in a case where the film thickness of the outermost layer 15 was 4 nm, the OD value was 1.68, which was not as good as that of tin oxide of Example 1. In a case where the film thickness of the outermost layer 15 was increased to 20 nm, the OD value was improved; however, the shadowing effect was observed due to the increase in the film thickness, and the line width in the y direction was deteriorated to 11.2 nm.

Table 3 shows the evaluation results of the three reflective photomasks according to Comparative Example 1. The evaluation items are the mask characteristics and the line width of the resist pattern transferred onto the wafer using the mask.

TABLE 3

| Absorption layer | | Outermost layer | | Mask characteristics | | Dimension | |
|---|---|---|---|---|---|---|---|
| Material | Film thickness | Material | Film thickness | OD | Hydrogen radical resistance | x direction | y direction |
| Tin oxide (n: 0.94, k: 0.07) | 26 nm | Tantalum (n: 0.94, k: 0.04) | 4 nm | 1.56 | 0.0 nm/s | 16.0 nm | 11.7 nm |
| | | | 10 nm | 1.76 | | 16.0 nm | 10.7 nm |
| | | | 20 nm | 2.23 | | 16.0 nm | 9.4 nm |

As shown in Table 3, in the three reflective photomasks according to Comparative Example 1, the absorption layer is constituted of tin oxide (where the refractive index n is 0.94, and the extinction coefficient k is 0.07), and the outermost layer is constituted of tantalum (where the refractive index n is 0.94, and the extinction coefficient k is 0.04). The film thickness of the absorption layer is 26 nm, and the film thickness of the outermost layer is 4 nm, 10 nm, and 20 nm.

As shown in Table 3, the hydrogen radical resistance of the reflective photomask according to Comparative Example was 0.0 nm, which was a good result. However, the shadowing effect was exhibited and the line width in the y direction was 11.7 nm even in a case where the film thickness of the outermost layer was as thin as 4 nm, which was a worse result than those of Examples 1 and 2. In addition, the OD value was 1.56, which indicated a decrease in contrast, and the surface reflection was stronger than in Examples 1 and 2, and the transfer performance was deteriorated. In a case where the film thickness of the outermost layer was increased, the CD value was improved; however, a strong shadowing effect was exhibited, and the line width in the y direction was further deteriorated.

Table 4 shows the evaluation results of one reflective photomask according to Comparative Example 2. The evaluation items are the mask characteristics and the line width of the resist pattern transferred onto the wafer using the mask.

TABLE 4

| Absorption layer | | Mask characteristics | | Dimension | |
|---|---|---|---|---|---|
| Material | Film thickness | OD | Hydrogen radical resistance | x direction | y direction |
| Tantalum (n: 0.94, k: 0.04) | 40 nm | 1.91 | 0.0 nm/s | 16.0 nm | — |

As shown in Table 4, in the reflective photomask according to Comparative Example 2, the absorption layer is constituted of tantalum (where the refractive index n is 0.94, and the extinction coefficient k is 0.04). The film thickness of the absorption layer is 40 nm. The absorption layer also serves as an outermost layer, and there is no outermost layer other than the absorption layer. As shown in Table 4, the hydrogen radical resistance of the reflective photomask according to Comparative Example 2 was 0.0 nm/s, which was good, and the OD value was 1.9, which was also good; however, the shadowing effect due to the film thickness was strong, and thus the pattern in the y direction was not resolved.

Table 5 shows the evaluation results of one reflective photomask according to Comparative Example 3. The evaluation items are the mask characteristics and the line width of the resist pattern transferred onto the wafer using the mask.

TABLE 5

| Absorption layer | | Mask characteristics | | Dimension | |
|---|---|---|---|---|---|
| Material | Film thickness | OD | Hydrogen radical resistance | x direction | y direction |
| Tin oxide (n: 0.94, k: 0.07) | 26 nm | 2.01 | 0.14 nm/s | 16.0 nm | 13.0 nm |

As shown in Table 5, in the reflective photomask according to Comparative Example 3, the absorption layer is constituted of tin oxide (where the refractive index n is 0.94, and the extinction coefficient k is 0.07). The film thickness of the absorption layer is 26 nm. The absorption layer also serves as an outermost layer, and there is no outermost layer other than the absorption layer. As shown in Table 5, the OD value of the reflective photomask according to Comparative Example 3 was 2.01, and the line width in the y direction was 13.0 nm, which were the best values; however, the hydrogen radical resistance was 0.14 nm/s, which was the worst result.

From the above evaluation results, it was found that the reflective photomask 200 in which the absorption layer 14 is constituted of tin oxide and the outermost layer 15 is constituted of silicon oxide has both good CD value and good hydrogen radical resistance, can reduce the shadowing effect, and has a long life and high transfer performance.

INDUSTRIAL APPLICABILITY

The reflective photomask blank and the reflective photomask according to the present invention can be applied to, for example, a manufacturing process of a semiconductor integrated circuit or the like. It can be suitably used in the process of forming a fine pattern with EUV exposure.

REFERENCE SIGNS LIST 1, 11: substrate
2, 12: multilayer reflective film
3, 13: capping layer
4, 14: absorption layer
5, 15: outermost layer
7, 17: reflection part
8, 18: low reflection part
8a, 18a: low reflection part pattern
10, 100: reflective photomask blank
16: back surface conductive film
18a-x: LS pattern
18a-y: LS pattern
19: resist film
19a: resist pattern
20, 200: reflective photomask
300: chamber
301: lower electrode 302: upper electrode
303: object to be evaluated
305: hydrogen plasma
310: plasma generating device

The invention claimed is:

1. A reflective photomask blank comprising:
a substrate;
a reflection part provided on the substrate and configured to reflect incident light; and
a low reflection part provided on the reflection part and configured to absorb incident light,
wherein the low reflection part has a multi-layer structure including at least two or more layers, and
an outermost layer of the low reflection part has a refractive index n equal to or more than 0.90 and an extinction coefficient k equal to or less than 0.02 with respect to extreme ultraviolet (EUV) light (where a wavelength is 13.5 nm),
wherein the outermost layer is constituted of a compound material in which an atomic number ratio of silicon (Si) to oxygen (O) is within a range of 1:1.5 to 1:2, and a total content of the silicon and the oxygen is 50% by atom or more of a whole compound material.

2. The reflective photomask blank according to claim 1, wherein the compound material constituting the outermost layer contains one or more elements selected from boron (B), nitrogen (N), germanium (Ge), and hafnium (Hf).

3. The reflective photomask blank according to claim 1, wherein the outermost layer has a film thickness equal to or more than 1 nm and equal to or less than 20 nm.

4. A reflective photomask blank comprising:
a substrate;
a reflection part provided on the substrate and configured to reflect incident light; and
a low reflection part provided on the reflection part and configured to absorb incident light,
wherein the low reflection part has a multi-layer structure including at least two or more layers, and
an outermost layer of the low reflection part has a refractive index n equal to or more than 0.90 and an extinction coefficient k equal to or less than 0.02 with respect to extreme ultraviolet (EUV) light (where a wavelength is 13.5 nm),
wherein the low reflection part has an absorption layer provided between the outermost layer and the reflection part and configured to absorb incident light, and
the absorption layer is constituted of a compound material having a refractive index n equal to or less than 0.95 and an extinction coefficient k equal to or more than 0.06 with respect to the EUV light.

5. The reflective photomask blank according to claim 4, wherein
the absorption layer is constituted of the compound material in which an atomic number ratio of tin (Sn) to oxygen (O) is within a range of 1:1 to 1:2, and a total content of the tin and the oxygen is 75% by atom or more of a whole compound material.

6. The reflective photomask blank according to claim 4, wherein
the absorption layer is constituted of the compound material in which an atomic number ratio of indium (In) to oxygen (O) is within a range of 1:1 to 1:1.5, and a total content of the indium and the oxygen is 80% by atom or more of a whole compound material.

7. The reflective photomask blank according to claim 4, wherein the compound material constituting the absorption layer contains one or more elements selected from boron (B), nitrogen (N), silicon (Si), germanium (Ge), and hafnium (Hf).

8. The reflective photomask blank according to claim 4, wherein the absorption layer has a film thickness equal to or more than 18 nm and equal to or less than 48 nm.

9. A reflective photomask blank comprising:
a substrate;
a reflection part provided on the substrate and configured to reflect incident light; and
a low reflection part provided on the reflection part and configured to absorb incident light,
wherein the low reflection part has a multi-layer structure including at least two or more layers, and
an outermost layer of the low reflection part has a refractive index n equal to or more than 0.90 and an extinction coefficient k equal to or less than 0.02 with respect to extreme ultraviolet (EUV) light (where a wavelength is 13.5 nm),
wherein the low reflection part has an optical density (an OD value) equal to or more than 1.5 with respect to the reflection part.

10. A reflective photomask comprising:
a substrate;
a reflection part provided on the substrate and configured to reflect incident light; and
a low reflection part provided on the reflection part and configured to absorb incident light,
wherein the low reflection part has a multi-layer structure including at least two or more layers, and
an outermost layer of the low reflection part has a refractive index n equal to or more than 0.90 and an extinction coefficient k equal to or less than 0.02 with respect to extreme ultraviolet (EUV) light (where a wavelength is 13.5 nm),
wherein the outermost layer is constituted of a compound material in which an atomic number ratio of silicon (Si) to oxygen (O) is within a range of 1:1.5 to 1:2, and a total content of the silicon and the oxygen is 50% by atom or more of a whole compound material.

11. The reflective photomask according to claim 10, wherein the compound material constituting the outermost layer contains one or more elements selected from boron (B), nitrogen (N), germanium (Ge), and hafnium (Hf).

12. The reflective photomask according to claim 10, wherein the outermost layer has a film thickness equal to or more than 1 nm and equal to or less than 20 nm.

13. A reflective photomask comprising:
a substrate;
a reflection part provided on the substrate and configured to reflect incident light; and
a low reflection part provided on the reflection part and configured to absorb incident light,
wherein the low reflection part has a multi-layer structure including at least two or more layers, and
an outermost layer of the low reflection part has a refractive index n equal to or more than 0.90 and an extinction coefficient k equal to or less than 0.02 with respect to extreme ultraviolet (EUV) light (where a wavelength is 13.5 nm),
wherein the low reflection part has an absorption layer provided between the outermost layer and the reflection part and configured to absorb incident light, and
the absorption layer is constituted of a compound material having a refractive index n equal to or less than 0.95 and an extinction coefficient k equal to or more than 0.06 with respect to the EUV light.

14. The reflective photomask according to claim 13, wherein the absorption layer is constituted of the compound material in which an atomic number ratio of tin (Sn) to oxygen (O) is within a range of 1:1 to 1:2, and a total content of the tin and the oxygen is 75% by atom or more of a whole compound material.

15. The reflective photomask according to claim 13, wherein the absorption layer is constituted of the compound material in which an atomic number ratio of indium (In) to oxygen (O) is within a range of 1:1 to 1:1.5, and a total content of the indium and the oxygen is 80% by atom or more of a whole compound material.

16. The reflective photomask blank according to claim 13, wherein the compound material constituting the absorption layer contains one or more elements selected from boron (B), nitrogen (N), silicon (Si), germanium (Ge), and hafnium (Hf).

17. The reflective photomask blank according to claim 13, wherein the absorption layer has a film thickness equal to or more than 18 nm and equal to or less than 48 nm.

18. A reflective photomask comprising:
a substrate;
a reflection part provided on the substrate and configured to reflect incident light; and
a low reflection part provided on the reflection part and configured to absorb incident light,
wherein the low reflection part has a multi-layer structure including at least two or more layers, and
an outermost layer of the low reflection part has a refractive index n equal to or more than 0.90 and an extinction coefficient k equal to or less than 0.02 with respect to extreme ultraviolet (EUV) light (where a wavelength is 13.5 nm),
wherein the low reflection part has an optical density (an OD value) equal to or more than 1.5 with respect to the reflection part.

* * * * *